US012701871B2

(12) United States Patent (10) Patent No.: US 12,701,871 B2
Jia et al. (45) Date of Patent: Aug. 4, 2026

(54) DISPLAY PANEL AND DISPLAY DEVICE

(71) Applicants: Hefei BOE Joint Technology Co., Ltd., Hefei (CN); BOE Technology Group Co., Ltd., Beijing (CN)

(72) Inventors: Wenbin Jia, Beijing (CN); Yonghao Gong, Beijing (CN); Feifei Zhu, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 380 days.

(21) Appl. No.: 18/579,872

(22) PCT Filed: Jul. 29, 2022

(86) PCT No.: PCT/CN2022/109122
§ 371 (c)(1),
(2) Date: Jan. 17, 2024

(87) PCT Pub. No.: WO2024/021072
PCT Pub. Date: Feb. 1, 2024

(65) Prior Publication Data
US 2025/0081741 A1 Mar. 6, 2025

(51) Int. Cl.
*H10K 59/122* (2023.01)
*H10K 59/80* (2023.01)
(52) U.S. Cl.
CPC ......... *H10K 59/122* (2023.02); *H10K 59/873* (2023.02)

(58) Field of Classification Search
None
See application file for complete search history.

(56) References Cited

U.S. PATENT DOCUMENTS

| | | | | |
|---|---|---|---|---|
| 11,315,992 B2 * | 4/2022 | Cui | .................... | H10K 71/00 |
| 11,545,069 B2 * | 1/2023 | Wang | .................... | G11C 19/28 |
| 2018/0059450 A1 * | 3/2018 | Li | .................... | G02F 1/133512 |

(Continued)

FOREIGN PATENT DOCUMENTS

| | | |
|---|---|---|
| CN | 104282729 A | 1/2015 |
| CN | 107403828 A | 11/2017 |

(Continued)

OTHER PUBLICATIONS

International Search Report for PCT/CN2022/109122 Mailed Mar. 14, 2023.

*Primary Examiner* — Alexander G Ghyka

(57) ABSTRACT

A display panel and a display device are provided. The display panel includes a base substrate and a pixel definition layer, the pixel definition layer includes multiple first retaining walls and multiple second retaining walls, and a height of the first retaining walls is less than a height of the second retaining walls. A first retaining wall includes multiple sub-retaining walls, a sub-retaining wall is located between two adjacent second retaining walls, multiple first structures are provided on a surface of at least one of the sub-retaining walls, a first structure includes a first sub-structure and a second sub-structure, the first sub-structure and the second sub-structure are alternately provided, and a height of the first sub-structure is less than or equal to the height of the first retaining wall.

20 Claims, 4 Drawing Sheets

(56)                    References Cited

U.S. PATENT DOCUMENTS

| | | | |
|---|---|---|---|
| 2019/0229161 A1 | 7/2019 | Hou et al. | |
| 2019/0333974 A1* | 10/2019 | Jiang ..................... | G03F 7/0007 |
| 2020/0295103 A1 | 9/2020 | Zou et al. | |
| 2021/0020711 A1 | 1/2021 | Hu | |
| 2021/0028403 A1* | 1/2021 | Jia ........................ | H10K 59/122 |
| 2021/0384279 A1* | 12/2021 | Li ...................... | H10K 59/1213 |
| 2022/0123077 A1 | 4/2022 | Cui | |
| 2022/0262879 A1 | 8/2022 | Cui | |
| 2022/0310976 A1* | 9/2022 | Lee ....................... | H10W 90/00 |
| 2023/0389349 A1* | 11/2023 | Wang .................... | H10K 71/00 |

FOREIGN PATENT DOCUMENTS

| | | | |
|---|---|---|---|
| CN | 107527939 A | 12/2017 | |
| CN | 109920825 A | 6/2019 | |
| CN | 107146807 B | 9/2019 | |
| CN | 111584605 A | 8/2020 | |
| CN | 112234085 A | 1/2021 | |
| CN | 113193024 A | 7/2021 | |
| CN | 113299867 A | 8/2021 | |

* cited by examiner (1)

(2)

(3)

DISPLAY PANEL AND DISPLAY DEVICE

CROSS-REFERENCE TO RELATED APPLICATION

The present application is a U.S. National Phase Entry of International Application PCT/CN2022/109122 having an international filing date of Jul. 29, 2022, and entitled "Display Panel and Display Device", the contents of which are hereby incorporated herein by reference in their entireties.

TECHNICAL FIELD

The present disclosure relates to the field of display technologies, in particular to a display panel and a display device.

BACKGROUND

An Organic Light-Emitting Diode (OLED) has advantages such as self-luminescence, fast response, wide viewing angle, high brightness, bright color, lightness and thinness, etc., compared with a Liquid Crystal Display (LCD), and is considered as a next generation display technology.

There are two main film forming methods for OLED devices: evaporation process and solution process. Among them, the evaporation process has been applied in mass production. However, due to a high material cost and a low material utilization rate of the evaporation process, a manufacturing cost of the OLED devices is high. The solution process includes spin coating, ink jet printing, nozzle coating methods, etc. It is suitable for polymer materials and soluble small molecule materials. An equipment cost of the solution process is low, which can reduce the manufacturing cost of the OLED devices.

By using the ink jet printing process, ink drops can be accurately dropped into openings of a pixel definition layer to form an organic thin film in the OLED devices. In related technologies, with a resolution of OLED devices continuously improved, an opening size in the pixel definition layer becomes less and less, resulting in a poor film uniformity of organic film in the OLED devices, which affects a service life and light emitting quality of the OLED devices.

SUMMARY

An embodiment of the present disclosure provides a display panel. The display panel includes:

a base substrate, wherein multiple pixel units arranged in an array in a first direction and a second direction are provided on the base substrate, and the first direction and the second direction are intersected with each other;

a pixel definition layer, located on the base substrate; wherein the pixel definition layer includes multiple first retaining walls and multiple second retaining walls; the multiple first retaining walls extend along the first direction and are arranged along the second direction, and the multiple second retaining walls extend along the second direction and are arranged along the first direction; the multiple first retaining walls and the multiple second retaining walls form multiple openings; a height of a first retaining wall is less than a height of a second retaining wall;

wherein the first retaining wall includes multiple sub-retaining walls, each of the sub-retaining walls is located between two adjacent second retaining walls;

multiple first structures are provided on a surface of at least one of the sub-retaining walls facing away from the base substrate, each first structure includes a first sub-structure and a second sub-structure, the first sub-structure and the second sub-structure are alternately provided, and a height of the first sub-structure is less than or equal to the height of the first retaining wall in a direction perpendicular to the base substrate.

Optionally, in an embodiment of the present disclosure, a first sub-structure of at least one of the first structures is a strip structure extending along the second direction and arranged along the first direction.

Optionally, in an embodiment of the present disclosure, the first sub-structure penetrates a width of the at least one sub-retaining wall in the second direction.

Optionally, in an embodiment of the present disclosure, the first sub-structure of at least one of the first structures is a strip structure extending along the first direction and arranged along the second direction.

Optionally, in an embodiment of the present disclosure, the first sub-structure penetrates a width of the at least one sub-retaining wall in the first direction.

Optionally, in an embodiment of the present disclosure, the first sub-structures on the surface of the at least one of the sub-retaining walls are distributed in an array.

Optionally, in an embodiment of the present disclosure, a cross-section shape of the first sub-structure in a direction parallel to the base substrate is a polygon, a circle, or an irregular shape.

Optionally, in an embodiment of the present disclosure, in the first direction, a ratio of a width of the first sub-structure to a width of the second sub-structure is between 0.5 and 1.5.

Optionally, in an embodiment of the present disclosure, the first sub-structure is a groove concave toward the surface of the at least one sub-retaining wall close to the base substrate.

Optionally, in an embodiment of the present disclosure, a ratio of a depth of the groove to a height of the at least one sub-retaining wall is greater than or equal to $\frac{1}{6}$ in the direction perpendicular to the base substrate.

Optionally, in an embodiment of the present disclosure, the first sub-structure is a protrusion projecting from the surface of the at least one sub-retaining wall away from the base substrate.

Optionally, in an embodiment of the present disclosure, a height of the protrusion is greater than or equal to $\frac{1}{6}$ of the height of the at least one sub-retaining wall.

Optionally, in an embodiment of the present disclosure, a surface of the first retaining wall is lyophilic and a surface of the second retaining wall is lyophobic.

Optionally, in an embodiment of the present disclosure, the pixel definition layer includes a first pixel definition layer and a second pixel definition layer, and the second pixel definition layer is located on a side of the first pixel definition layer facing away from the base substrate; and the first pixel definition layer includes the multiple first retaining walls and the second pixel definition layer includes the multiple second retaining walls.

Accordingly, an embodiment of the present disclosure further provides a display device, including any of the above display panels.

DETAILED DESCRIPTION

Figure 1:
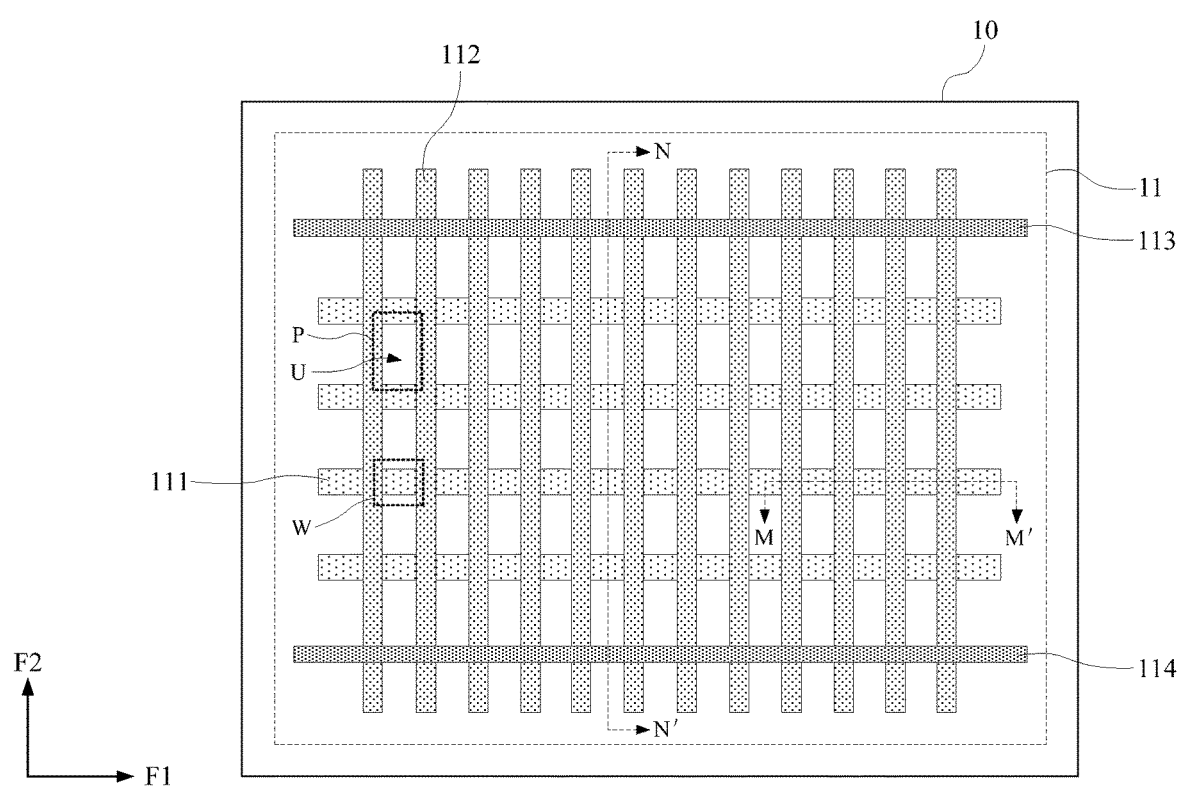
FIG. 1 is a top-view schematic structural diagram of a display panel according to an embodiment of the present disclosure.

An embodiment of the present disclosure provides a display panel and a display device aiming at a problem of a poor film formation uniformity of organic film layers formed by an ink jet printing process.

The display panel and the display device according to embodiments of the present disclosure will be described in detail with reference to the accompanying drawings. A thickness and a shape of each film layer in the drawings are not drawn to actual scales, and are only for the purpose of schematically illustrating the present disclosure.

Figure 2:
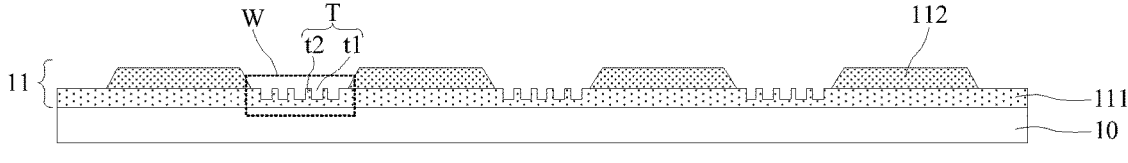
FIG. 2 is a schematic cross-section view along a dotted line MM' in FIG. 1.
Figure 3:
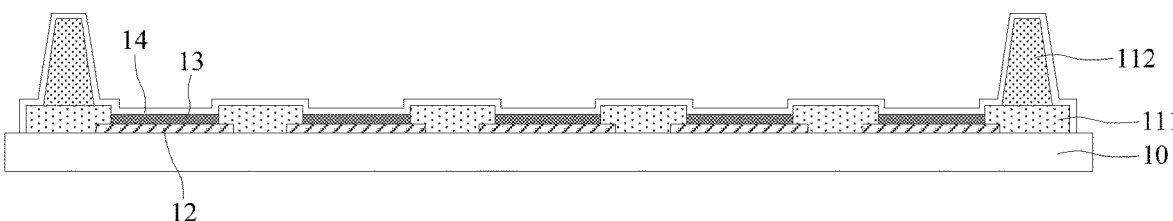
FIG. 3 is a schematic cross-section view along a dotted line NN' in FIG. 1.

FIG. 1 is a top-view schematic structural diagram of a display panel according to an embodiment of the present disclosure. FIG. 2 is a schematic cross-section view along a dotted line MM' in FIG. 1. FIG. 3 is a schematic cross-section view along a dotted line NN' in FIG. 1. As shown in FIG. 1 to FIG. 3, the display panel according to an embodiment of the present disclosure may include a base substrate 10 and a pixel definition layer 11 positioned above the base substrate 10.

The base substrate 10 has functions of supporting and load-bearing. Generally, the base substrate 10 may be a glass substrate. When the display panel is applied to a flexible display device, the base substrate 10 may also be a flexible substrate, and a specific material of the base substrate 10 is not limited herein. On the base substrate 10, multiple pixel units P are arranged in an array in a first direction F1 and a second direction F2, and the first direction F1 and the second direction F2 are intersected with each other. For example, the first direction F1 and the second direction F2 may be perpendicular to each other. In specific implementation, the first direction F1 may be a row direction of the pixel units P and the second direction F2 may be a column direction of the pixel units P. Or, the first direction F1 may be a column direction of the pixel units P and the second direction F2 may be a row direction of the pixel units P, which are not limited herein.

The pixel definition layer 11 may include multiple first retaining walls 111 and multiple second retaining walls 112. The first retaining walls extend along the first direction F1 and are arranged along the second direction F2, the second retaining walls extend along the second direction F2 and are arranged along the first direction F1, and a height of a first retaining wall 111 is less than a height of a second retaining wall 112. The first retaining walls 111 and the second retaining walls 112 form multiple openings U, which may be used to define regions of the pixel units P.

The display panel according to the embodiment of the present disclosure may be an organic electroluminescent display panel. Referring to FIG. 3, the aforementioned display panel may further include multiple first electrodes 12, multiple second electrodes 13, and an organic light emitting functional layer 14 positioned between the first electrode 12 and the second electrode 13. The aforementioned first electrodes 12 are anodes and the second electrodes 13 are cathodes. Or, the aforementioned first electrodes 12 are cathodes and the second electrodes 13 are anodes, which are not limited herein. The pixel definition layer 11 includes multiple openings U, the openings U are for defining regions of the pixel units P. Each of the openings U is in one-to-one correspondence with one of the first electrodes 12 respectively, and each of the openings U respectively expose a corresponding first electrode 12, therefore the organic light emitting functional layer 14 can be in contact with the first electrode 12, so that the first electrodes 12 can provide carriers to the organic light emitting functional layer 14. In addition, a drive circuit may be included between the first electrodes 12 and the base substrate 10. The drive circuit is electrically connected with the first electrodes 12, the first electrodes 12 may be disposed separately, and the second electrodes 13 may be disposed in an entire layer. Driving signals are provided to each of the first electrodes 12 through the drive circuit, thereby implementing image display.

In specific implementation, the organic light emitting functional layer 14 may include organic film layers such as a light emitting layer, a hole injection layer, a hole transport layer, an electron injection layer and an electron transport layer. In an embodiment of the present disclosure, each of organic film layers in the organic light emitting functional layer 14 may be manufactured by an ink jet printing process, and the organic light emitting functional layer 14 of the pixel unit P of a same color may be made of a same material during the ink jet printing process.

It can be understood that in order to clearly illustrate the structure of the pixel definition layer, film layers such as the first electrodes, the second electrodes, and the organic light emitting functional layer are omitted in FIG. 1 and FIG. 2.

Continuing with reference to FIG. 1 to FIG. 3, in an embodiment of the present disclosure, the first retaining walls 111 extend in the first direction F1 and are arranged in the second direction F2, the second retaining walls 112 extend in the second direction F2 and are arranged in the first direction F1. The first retaining walls 111 and the multiple second retaining walls 112 form multiple openings U, and the openings U are for defining regions of the pixel units P. During a manufacturing process, ink of the organic film layer may be dripped into the openings U by an ink jet printing process to form the organic film layer of the organic light emitting functional layer 14 in the openings U. Since a height of the first retaining walls 111 is less than a height of the second retaining walls 112, the ink can flow in a column of openings U arranged along the second direction F2 during the ink jet printing process, thereby enhancing fluidity of the ink, averaging ink content in each of the openings U, reducing a volume difference of the ink in each of the openings U, and thereby improving the film formation uniformity of the ink. Moreover, since the column of openings U arranged along the second direction F2 are communicated with each other, the colors of the column of the pixel units P arranged along the second direction F2 formed by the ink jet printing process are the same.

In practical applications, the less the height of the first retaining walls 111, the better the fluidity of the ink flowing in a column of the openings U arranged along the second direction F2. However, due to technological limitations, the height of the first retaining walls 111 cannot be further reduced, and therefore the film formation uniformity of the ink is difficult to be further improved.

In the display panel according to the present disclosure, a first retaining wall 111 may include multiple sub-retaining walls W, and each of the multiple sub-retaining walls W is located between two adjacent second retaining walls 112. At least one of the sub-retaining walls 111 is provided with multiple first structures T on a surface facing away from the base substrate 10. The first structures T include first sub-structures t1 and second sub-structures t2, and the first sub-structures t1 and the second sub-structures t2 are alternately provided. A height of a first sub-structure t1 is less than or equal to a height of a first retaining wall 111 in a direction perpendicular to the base substrate 10, and the second sub-structure t2 may be a gap between adjacent first sub-structures t1. In specific implementation, the first sub-structure t1 may be a groove concave toward a surface of the sub-retaining wall W close to the base substrate 10, and the height of the first sub-structure t1 refers to a depth of the groove. Or, the first sub-structure t1 may be a protrusion projecting from a surface of the sub-retaining wall W away from the base substrate, the height of the aforementioned first sub-structure t1 refers to a thickness of the protrusion.

In an embodiment of the present disclosure, by providing the first structure T on the surface of the sub-retaining wall W, a surface area of the sub-retaining wall W can be increased. During the ink jet printing process, a contact area between the ink and the first retaining wall 111 can be increased, a contact angle between the ink and the first retaining wall 111 can be reduced, and fluidity of the ink can be increased, thereby further improving the film formation uniformity of the ink. Moreover, process requirements on ink jet printing equipment can be reduced, and an ink jet printing process window can be improved, thereby reducing equipment cost. In specific implementation, first structures T may be provided on a surface of each of the sub-retaining walls W, or first structures T may also be provided on surfaces of part of the sub-retaining walls W in the display panel. For example, the first structures T may be provided only on surfaces of the sub-retaining walls W in regions where the fluidity of the ink is poor, and the first structures T may be provided according to actual needs, which is not limited herein.

Figure 4:
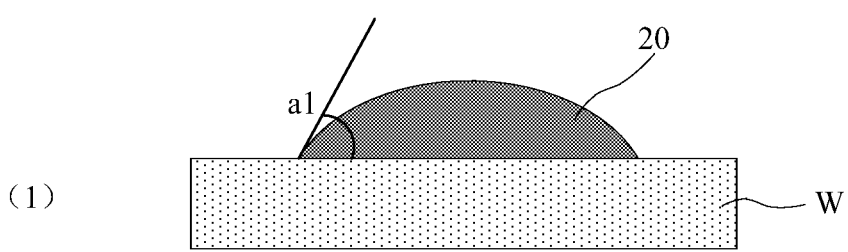
FIG. 4 is a schematic diagram of a principle of improving a fluidity of an ink with a first structure according to an embodiment of the present disclosure.
Figure 4:
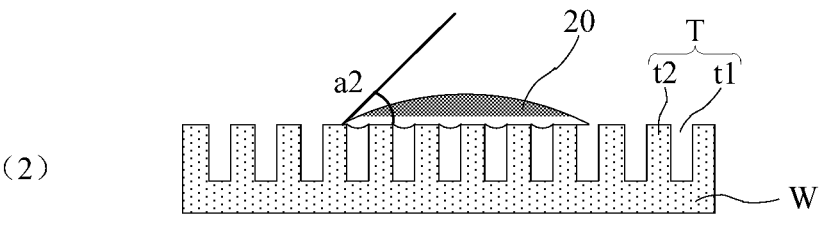
Figure 4:
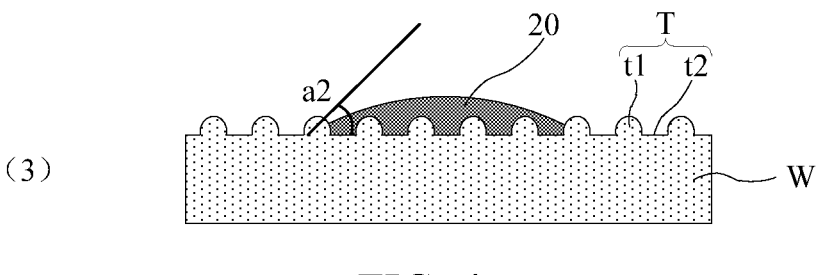

FIG. 4 is a schematic diagram of a principle of improving a fluidity of an ink with a first structure according to an embodiment of the present disclosure. As shown in FIG. 4, (1) of FIG. 4 is a schematic diagram in which the first structure is not provided on a surface of the sub-retaining wall, and (2) and (3) of FIG. 4 are schematic diagrams in which the first structure is provided on a surface of the sub-retaining wall. As shown in (2) of FIG. 4, in one possible implementation, the aforementioned first sub-substructures t1 may be grooves concave toward a surface of the sub-retaining wall W close to the base substrate, and second sub-structures t2 may be gaps between two adjacent grooves. As shown in (3) of FIG. 4, in another possible implementation, the aforementioned first sub-structures t1 may be protrusions projecting from a surface of the sub-retaining wall W away from the base substrate, and the second sub-structures t2 may be gaps between two adjacent protrusions.

In conjunction with (1) to (3) in FIG. 4, a contact angle between the ink 20 and the surface of the sub-retaining wall W satisfies the following relationship:

$$\cos a2 = r * \cos a1;$$

where a1 represents a contact angle between a drop of ink 20 and a surface of the sub-retaining wall W when the first structure is not provided on the surface of the sub-retaining wall W; a2 represents a contact angle between the drop of the ink 20 and the surface of the sub-retaining wall W when the first structure T is provided on the surface of the sub-retaining wall W.

r is a proportional coefficient, and r=actual solid-liquid contact area/apparent solid-liquid contact area, and the apparent solid-liquid contact area can be understood as a projected area of the ink 20 on the surface of the sub-retaining wall W.

In an embodiment of the present disclosure, by disposing the first structure T on the surface of the sub-retaining wall W, a surface area of the sub-retaining wall W can be increased, thereby increasing a contact area between the ink 20 and the sub-retaining wall W, so that the proportional coefficient r>1. According to the above relational expression, it can be known that cos a2>cos a1, and then a2<a1 can be obtained, that is, when the first structure T is provided on the surface of the sub-retaining wall W, the contact angle between the ink 20 and the sub-retaining wall W is less. Therefore, by providing the first structure T on the surface of the sub-retaining wall W, the contact angle between the ink 20 and the sub-retaining wall W can be reduced, thereby improving the fluidity of the ink.

In one possible implementation, the surface of the first retaining wall 111 may be lyophilic, the first retaining wall 111 may be made of a lyophilic material, or the first retaining wall 111 may be surface treated, therefore the surface of the first retaining wall 111 is lyophilic, so that the ink can flow in the column of openings U arranged along the second direction F2. The surface of the second retaining wall 112 may be lyophobic, the second retaining wall 112 may be made of a lyophobic material, or the second retaining wall 112 may be surface treated therefore the surface of the second retaining wall 112 is lyophobic and the ink is prevented from overflowing to a region outside the openings U.

Continuing with reference to FIG. 4, during an ink jet printing process, contact between the ink 20 and a surface of the sub-retaining wall W may satisfy a solid-liquid surface wetting mode. For example, as shown in (2) of FIG. 4, the contact between the ink 20 and the surface of the sub-retaining wall W may satisfy a cassie wetting mode, i.e. the ink 20 does not fill the gaps between adjacent first sub-structures t1. As shown in (3) of FIG. 4, the contact between the ink 20 and the surface of the sub-retaining wall W may satisfy a wezel wetting mode, i.e. the ink 20 may fill the gaps between adjacent first sub-structures t1.

As shown in FIG. 1, in an embodiment of the present disclosure, the pixel definition layer 11 may further include a third retaining wall 113 and a fourth retaining wall 114 extending along the first direction F1, and the third retaining wall 113 and the fourth retaining wall 114 are respectively positioned on two sides of the first retaining walls 111 in the second direction F2. A height of the third retaining wall 113 is greater than a height of the first retaining walls 111, and a height of the fourth retaining wall 114 is greater than a height of the first retaining walls 111. During the ink jet printing process, the ink can flow along the second direction F2, and the ink overflow can be prevented by providing the third retaining wall 113 and the fourth retaining wall 114 with a higher height on two sides of the pixel definition layer 11. In specific implementation, the third retaining wall 113 and the fourth retaining wall 114 can be made of a lyophobic material, or surface treatment can be performed on the third retaining wall 113 and the fourth retaining wall 114, therefore the surfaces of the third retaining wall 113 and the fourth retaining wall 114 can be lyophobic, so that effectively preventing ink overflow.

Figure 5:
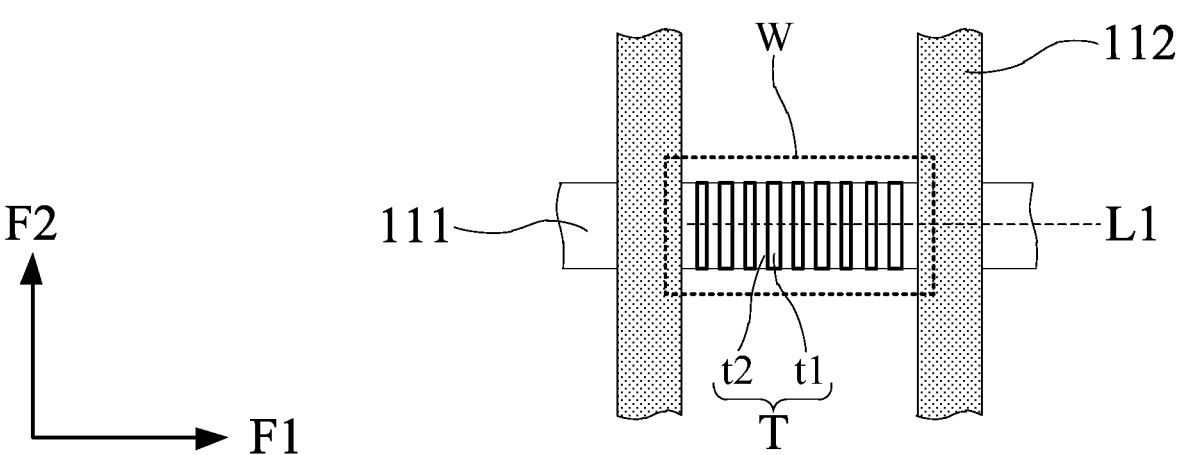
FIG. 5 is a partial enlarged schematic diagram of a sub-retaining wall in FIG. 1.

FIG. 5 is a partial enlarged schematic diagram of a sub-retaining wall in FIG. 1. As shown in FIG. 5, in some embodiments of the present disclosure, first sub-structures t1 of at least one of the first structures T may be strip structures extending along the second direction F2 and arranged along the first direction F1. In this way, an extension direction of the first sub-structures t1 is substantially consistent with a flow direction of the ink, and the fluidity of the ink can be further enhanced, so that the uniformity of the formed organic film layer is better. The strip structures may be grooves, or the strip structures may be protrusions, which is not limited herein.

Continuing with reference to FIG. 5, in order to further enhance the fluidity of the ink, the first sub-structures t1 may penetrate a width of the sub-retaining wall W in the second direction F2, thereby avoiding ends of the first sub-structures t1 in the second direction F2 from affecting the fluidity of the ink.

Figure 6:
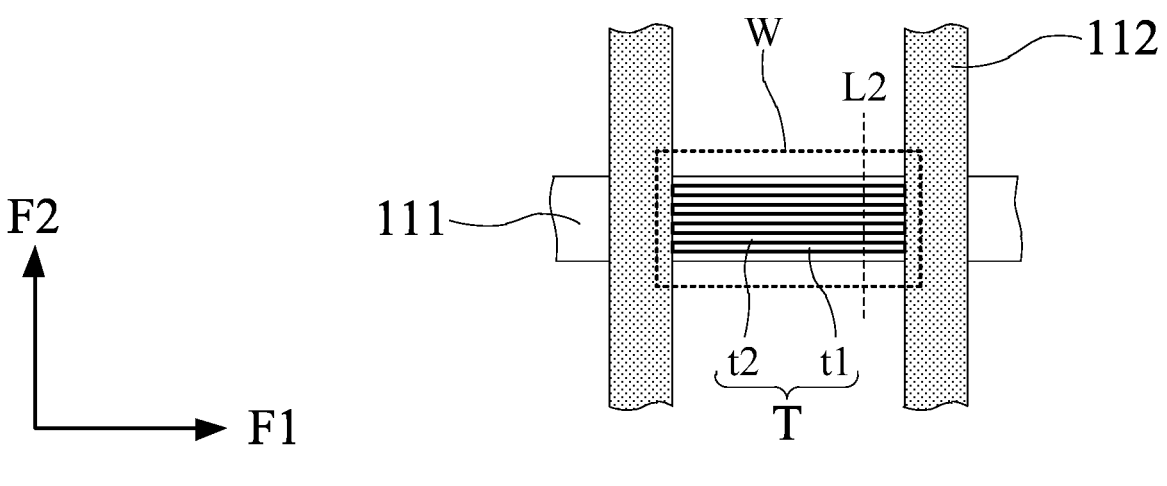
FIG. 6 is another partial enlarged schematic diagram of a sub-retaining wall in FIG. 1.

FIG. 6 is another partial enlarged schematic diagram of a sub-retaining wall in FIG. 1. As shown in FIG. 6, in some embodiments of the present disclosure, first sub-structures t1 of at least one of the first structures T may be strip structures extending along the first direction F1 and arranged along the second direction F2. This can also enhance the fluidity of the ink, so that the uniformity of the formed organic film layer is better. The strip structures may be grooves, or the strip structures may be protrusions, which is not limited herein.

Continuing with reference to FIG. 6, in order to further enhance the fluidity of the ink, the first sub-structures t1 may penetrate a width of the sub-retaining wall W in the first direction F1, thereby avoiding ends of the first sub-structure t1 in the first direction F1 from affecting the fluidity of the ink.

In specific implementation, there may be an included angle the extension direction of the first sub-structures t1 and the second direction F2, which is not limited herein.

Figure 7:
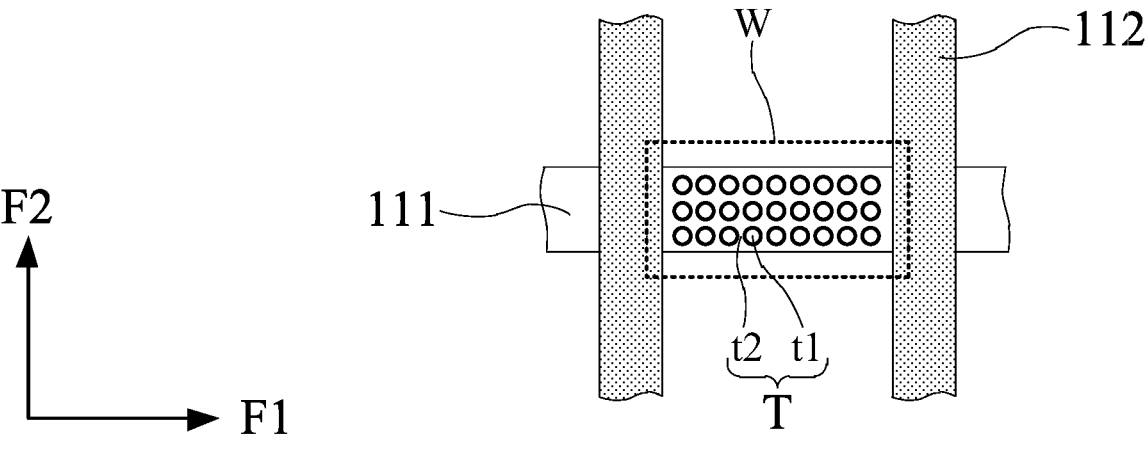
FIG. 7 is another partial enlarged schematic diagram of a sub-retaining wall in FIG. 1.

FIG. 7 is another partial enlarged schematic diagram of a sub-retaining wall in FIG. 1. As shown in FIG. 7, in some other embodiments of the present disclosure, first sub-structures t1 on a surface of at least one of the sub-retaining walls W may be distributed in an array. In this way, the first sub-structures t1 does not block the flowing of the ink, so that the fluidity of the ink can be improved by increasing a surface area of the sub-retaining wall W without affecting the flowing of the ink. In specific implementation, the first sub-structures t1 shown in FIG. 7 may be grooves or protrusions. In specific implementation, a cross-section shape of a first sub-structure t1 in a direction parallel to the base substrate may be a polygon, a circle or an irregular pattern. For example, a shape of the first sub-structure t1 in FIG. 7 may be a circle, and of course, a shape of the first sub-structure t1 may also be other shapes, such as an ellipse or a square, which is not limited herein. In some cases, the multiple first sub-structures t1 on the surface of the sub-retaining wall W may also be distributed in a non-array manner and may be provided according to actual situations, which is not limited herein.

Figure 8:
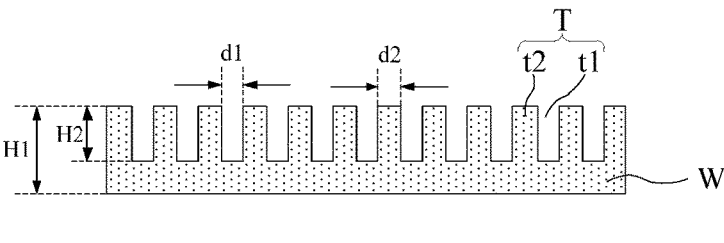
FIG. 8 is a schematic cross-section view of a sub-retaining wall according to an embodiment of the present disclosure.
Figure 9:
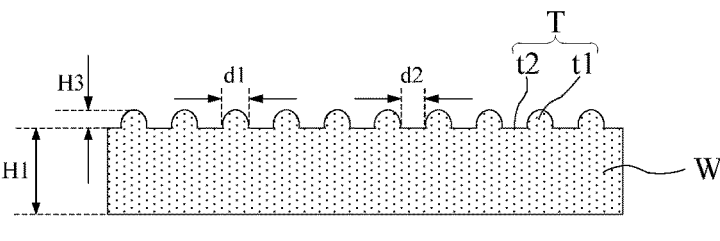
FIG. 9 is another schematic structural diagram of a sub-retaining wall according to an embodiment of the present disclosure.

FIG. 8 is a schematic cross-section view of a sub-retaining wall according to an embodiment of the present disclosure and FIG. 9 is another schematic structural diagram of a sub-retaining wall according to an embodiment of the present disclosure. In one possible implementation, FIG. 8 and FIG. 9 may be schematic cross-section views along a dotted line L1 in FIG. 5, and in conjunction with FIG. 5, FIG. 8 and FIG. 9, a ratio of a width d1 of a first sub-structure t1 to a width d2 of a second sub-structure t2 in the first direction F1 may be between 0.5 and 1.5. As shown in FIG. 5 and FIG. 8, when the first sub-structure t1 is a groove concave toward a surface of the sub-retaining wall W close to the base substrate, the width d1 of the first sub-structure t1 may be a width inside the groove, and the width d2 of the second sub-structure t2 may be a width of a sub-retaining wall W between two adjacent grooves. As shown in FIG. 5 and FIG. 9, when the first sub-structure t1 is a protrusion projecting from the surface of the sub-retaining wall W away from the base substrate, the width d1 of the first sub-structure t1 may be a width of the protrusion, and the width d2 of the second sub-structure t2 may be a width of a gap between two adjacent protrusions. A ratio between the width d1 of the first sub-structure t1 and the width d2 of the second sub-structure t2 is provided to be between 0.5 and 1.5, that is, the width d1 of the first sub-structure t1 and the width d2 of the second sub-structure t2 are similar in size, so that the first sub-structures t1 on the surface of the sub-retaining wall W can be prevented from being too sparse or too dense, and the fluidity of the ink on the surface of the sub-retaining wall W can be ensured.

In another possible implementation, FIG. 8 and FIG. 9 may be schematic cross-section views along the dotted line L2 in FIG. 6, and in conjunction with FIG. 6, FIG. 8 and FIG. 9, a ratio of the width d1 of the first sub-structure t1 to the width d2 of the second sub-structure t2 in the second direction F2 may be between 0.5 and 1.5. As shown in FIG. 6 and FIG. 8, when the first sub-structure t1 is a groove concave toward the surface of the sub-retaining wall W close to the base substrate, the width d1 of the first sub-structure t1 may be a width inside the groove, and the width d2 of the second sub-structure t2 may be a width of a sub-retaining wall W between two adjacent grooves. As shown in FIG. 6 and FIG. 9, when the first sub-structure t1 is a protrusion projecting from the surface of the sub-retaining wall W away from the base substrate, the width d1 of the first sub-structure t1 may be a width of the protrusion, and the width d2 of the second sub-structure t2 may be a width of a gap between two adjacent protrusions. A ratio between the width d1 of the first sub-structure t1 and the width d2 of the second sub-structure t2 is provided to be between 0.5 and 1.5, that is, the width d1 of the first sub-structure t1 and the width d2 of the second sub-structure t2 are similar in size, so that the first sub-structures t1 on the surface of the sub-retaining wall W can be prevented from being too sparse or too dense, and the fluidity of the ink on the surface of the sub-retaining wall W can be ensured.

In another possible implementation, as shown in FIG. 7, when the first sub-structures t1 on a surface of the sub-retaining wall W are distributed in an array, a ratio of the width of the first sub-structure t1 to the width of the second sub-structure t2 may be between 0.5 and 1.5 in any direction parallel to the base substrate. Therefore, the first sub-structures t1 on the surface of the sub-retaining wall W can be prevented from being too sparse or too dense and the fluidity of the ink on the surface of the sub-retaining wall W can be ensured to be better.

In some embodiments of the present application, referring to FIG. 8 and FIG. 9, a minimum width d1 of the first sub-structure t1 may be between 0.2 μm and 3 μm, i.e. 0.2 μm≤d1≤3 μm, preferably 0.5 μm≤d1≤3 μm. Providing the minimum width d1 of the first substructure t1 within this range can effectively improve the fluidity of the ink, and avoid a size of the first sub-structure t1 being too small which results in an insignificant improvement in the fluidity of the ink, and avoid a size of the first sub-structure t1 being too large which affects the flowing of the ink.

In addition, a minimum width d2 of the second sub-structure t2 may be between 0.2 μm and 3 μm, i.e. 0.2 μm≤d2≤3 μm, preferably 0.5 μm≤d2≤3 μm, so that the first sub-structures t1 on the surface of the sub-retaining wall W can be avoided from being too sparse or too dense, and the good fluidity of the ink on the surface of the sub-retaining wall W can be ensured.

As shown in FIG. 8, when the first sub-structure t1 is a groove concave toward the surface of the sub-retaining wall W close to the base substrate. In a direction perpendicular to the base substrate, a ratio of a depth H2 of the groove to a height H1 of the sub-retaining wall W is greater than or equal to ⅙, i.e. H1/6≤H2≤H1, preferably H1/4≤H2≤H1 so that the fluidity of the ink can be effectively improved to avoid a depth of the groove being too small which results in an insignificant improvement in the fluidity of the ink. Moreover, the depth H2 of the groove may be equal to the height H1 of the sub-retaining wall W, that is, the groove may penetrate the sub-retaining wall W in a thickness direction, and a height of the organic film layer formed after evaporation of solvent of the ink may be lower than a height of the sub-retaining wall W, so that the groove penetrates the sub-retaining wall W in the thickness direction without affecting a display effect of adjacent pixel units.

As shown in FIG. 9, when the first sub-structure t1 is a protrusion projecting from the surface of the sub-retaining wall W away from the base substrate, a height H3 of the protrusion is greater than or equal to ⅙ of the height H1 of the sub-retaining wall W, i.e. H1/6≤H3≤H1, preferably H1/4≤H3≤H1, so that the fluidity of the ink can be effectively improved. It is possible to avoid the height of the protrusion being too small, which results in an insignificant improvement in the fluidity of the ink, and avoid the height of the protrusion being too large, which affects the flowing of the ink.

In specific implementation, the height H1 of the sub-retaining wall W can be provided as 0.1 μm≤H1≤0.5 μm.

In practical applications, the first structures T may be manufactured using an photosensitive material, such as photoresist, so that a pattern of the first structure T can be obtained through a lithography process. Or, the first structures T may be manufactured using an organic material, such as resin or acrylic, so that the pattern of the first structures T can be obtained through an etching process. Of course, other materials and processes may be used to manufacture the first structures T, which are not limited herein.

Figure 10:
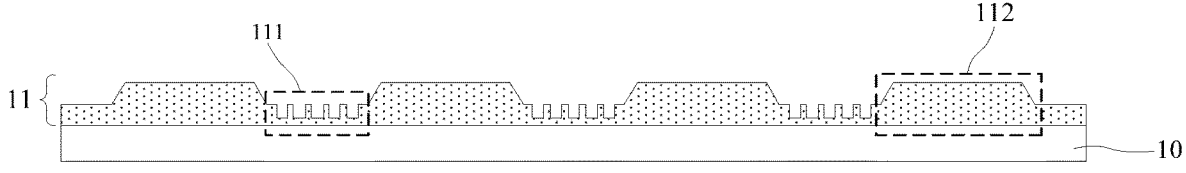
FIG. 10 is another schematic cross-section view along a dotted line MM' in FIG. 1.

FIG. 10 is another schematic cross-section view along a dotted line MM' in FIG. 1. As shown in FIG. 10, in some embodiments of the present disclosure, the pixel definition layer 11 may be of an integral structure, i.e. the first retaining wall 111 and the second retaining wall 112 may be manufactured by a same patterning process, so that a quantity of times of patterning processes is reduced and the manufacturing cost can be saved. In an actual process, the first retaining wall 111 and the second retaining wall 112 with different heights may be manufactured using a half tone mask plate. In specific implementation, the first retaining wall 111, the second retaining wall 112, the third retaining wall and the fourth retaining wall in the pixel definition layer 11 may be of an integral structure, and the first retaining wall, the second retaining wall, the third retaining wall and the fourth retaining wall may be formed by a same patterning process, thereby further simplifying the manufacturing process and saving the manufacturing cost.

Figure 11:
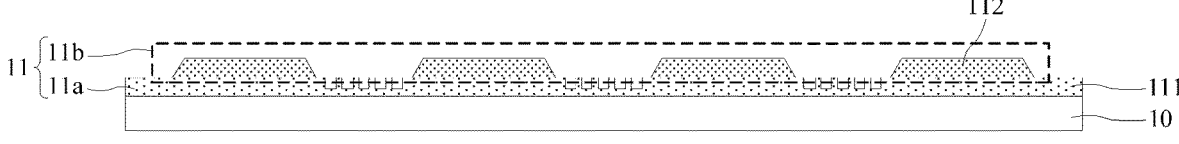
FIG. 11 is another schematic cross-section view along a dotted line MM' in FIG. 1.

FIG. 11 is another schematic cross-section view along a dotted line MM' in FIG. 1. As shown in FIG. 11, in some other embodiments of the present disclosure, the pixel definition layer 11 may include a first pixel definition layer 11*a* and a second pixel definition layer 11*b*, the second pixel definition layer 11*b* is located on a side of the first pixel definition layer 11*a* facing away from the base substrate 10. The first pixel definition layer 11*a* may include multiple first retaining walls 111, and the second pixel definition layer 11*b* may include multiple second retaining walls 112. In an actual process, the first retaining walls 111 and the second retaining walls 112 may be manufactured by different patterning processes, so that the patterns of each patterning process are highly consistent, the process difficulty can be reduced, and the manufacturing cost can be saved. In specific implementation, the second pixel definition layer 11*b* may further include a third retaining wall and a fourth retaining wall. Since heights of the second retaining wall, the third retaining wall and the fourth retaining wall are all greater than a height of the first retaining wall, and surfaces of the second retaining wall, the third retaining wall and the fourth retaining wall are all lyophobic, the second retaining wall, the third retaining wall and the fourth retaining wall may be formed by a same patterning process in an actual process, thereby further simplifying the manufacturing process and saving the manufacturing cost.

Based on a same inventive concept, an embodiment of the present disclosure further provides a display device including the aforementioned display panel. The display device may be applied to any product or component with a display function, such as a mobile phone, a tablet computer, a television, a display, a laptop computer, a digital photo frame, and a navigator. Since the principle for solving problems of the display device is similar to the principle for solving problems of the display panel described above, the implementations of the display panel described above may be referred to for the implementations of the display device, which will not be repeated here.

Although preferred embodiments of the present disclosure have been described, those skilled in the art may make additional changes and modifications to these embodiments once underlying inventive concepts are known. Therefore, the appended claims are intended to be interpreted to encompass preferred embodiments as well as all changes and modifications falling within the scope of the present disclosure.

Apparently, various modifications and variations to the embodiments of the present disclosure may be made by those skilled in the art without departing from the spirit and scope of the embodiments of the present disclosure. Thus, if these modifications and variations to the embodiments of the present disclosure fall within the scope of the claims of the present disclosure and their equivalent techniques, the present disclosure is intended to include these modifications and variations.

The invention claimed is:

1. A display panel, comprising:

a base substrate, wherein a plurality of pixel units arranged in an array in a first direction and a second direction are provided on the base substrate, and the first direction and the second direction are intersected with each other;

a pixel definition layer, located on the base substrate; wherein the pixel definition layer comprises a plurality of first retaining walls and a plurality of second retaining walls; the plurality of first retaining walls extend along the first direction and are arranged along the second direction, and the plurality of second retaining walls extend along the second direction and are arranged along the first direction; the plurality of first retaining walls and the plurality of second retaining walls form a plurality of openings; a height of a first retaining wall is less than a height of a second retaining wall; and wherein the first retaining wall comprises a plurality of sub-retaining walls, each of the sub-retaining walls is located between two adjacent second retaining walls; a plurality of first structures are provided on a surface of at least one sub-retaining wall facing away from the base substrate, each of the first structures comprises a first sub-structure and a second sub-structure, the first sub-structure and the second sub-structure are alternately provided, and a height of the first sub-structure is less than or equal to the height of the first retaining wall in a direction perpendicular to the base substrate.

2. The display panel according to claim 1, wherein a first sub-structure of at least one of the first structures is a strip structure extending along the second direction and arranged along the first direction.

3. The display panel according to claim 2, wherein the first sub-structure penetrates a width of the at least one sub-retaining wall in the second direction.

4. The display panel according to claim 1, wherein a first sub-structure of at least one of the first structures is a strip structure extending along the first direction and arranged along the second direction.

5. The display panel according to claim 4, wherein the first sub-structure penetrates a width of the at least one sub-retaining wall in the first direction.

6. The display panel according to claim 1, wherein the first sub-structures on the surface of the at least one sub-retaining wall are distributed in an array.

7. The display panel according to claim 6, wherein a cross-section shape of the first sub-structure in a direction parallel to the base substrate is a polygon, a circle, or an irregular shape.

8. The display panel according to claim 2, wherein in the first direction, a ratio of a width of the first sub-structure to a width of the second sub-structure is between 0.5 and 1.5.

9. The display panel according to claim 1, wherein the first sub-structure is a groove concave toward the surface of the at least one sub-retaining wall close to the base substrate.

10. The display panel according to claim 9, wherein a ratio of a depth of the groove to a height of the at least one sub-retaining wall is greater than or equal to $\frac{1}{6}$ in the direction perpendicular to the base substrate.

11. The display panel according to claim 1, wherein the first sub-structure is a protrusion projecting from the surface of the at least one sub-retaining wall away from the base substrate.

12. The display panel according to claim 10, wherein a height of the protrusion is greater than or equal to $\frac{1}{6}$ of the height of the at least one sub-retaining wall.

13. The display panel according to claim 1, wherein surfaces of the first retaining walls are lyophilic and surfaces of the second retaining wall are lyophobic.

14. The display panel according to claim 1, wherein the pixel definition layer comprises: a first pixel definition layer and a second pixel definition layer, and the second pixel definition layer is located on a side of the first pixel definition layer facing away from the base substrate; and the first pixel definition layer comprises the plurality of first retaining walls and the second pixel definition layer comprises the plurality of second retaining walls.

15. A display device, comprising the display panel according to claim 1.

16. The display panel according to claim 3, wherein in the first direction, a ratio of a width of the first sub-structure to a width of the second sub-structure is between 0.5 and 1.5.

17. The display panel according to claim 2, wherein the first sub-structure is a groove concave toward the surface of the at least one sub-retaining wall close to the base substrate.

18. The display panel according to claim 3, wherein the first sub-structure is a groove concave toward the surface of the at least one sub-retaining wall close to the base substrate.

19. The display panel according to claim 4, wherein the first sub-structure is a groove concave toward the surface of the at least one sub-retaining wall close to the base substrate.

20. The display panel according to claim 5, wherein the first sub-structure is a groove concave toward the surface of the at least one sub-retaining wall close to the base substrate.

* * * * *